US010271636B2

(12) United States Patent
Withers et al.

(10) Patent No.: US 10,271,636 B2
(45) Date of Patent: Apr. 30, 2019

(54) ARCHIMEDES BRUSH FOR SEMICONDUCTOR CLEANING

(71) Applicant: ILLINOIS TOOL WORKS INC., Glenview, IL (US)

(72) Inventors: Bradley Scott Withers, El Dorado Hills, CA (US); Erik Scott Nelson, Roseville, CA (US); Robert Allen Willis, Diamond Springs, CA (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 1147 days.

(21) Appl. No.: 14/537,707

(22) Filed: Nov. 10, 2014

(65) Prior Publication Data

US 2016/0128460 A1   May 12, 2016

(51) Int. Cl.
| | | |
|---|---|---|
| *H01L 21/02* | (2006.01) | |
| *A46B 9/08* | (2006.01) | |
| *B08B 1/00* | (2006.01) | |
| *H01L 21/67* | (2006.01) | |
| *A46B 13/00* | (2006.01) | |
| *A46D 1/00* | (2006.01) | |

(52) U.S. Cl.
CPC .............. *A46B 9/08* (2013.01); *A46B 13/001* (2013.01); *A46B 13/006* (2013.01); *B08B 1/002* (2013.01); *H01L 21/67046* (2013.01); *A46D 1/0207* (2013.01)

(58) Field of Classification Search
CPC . H01L 21/02; H01L 21/67046; A46B 13/006; B08B 1/002
See application file for complete search history.

(56) References Cited

U.S. PATENT DOCUMENTS

| | | | |
|---|---|---|---|
| 3,139,641 A | 7/1964 | Grogan et al. | |
| 5,375,291 A | 12/1994 | Tateyama et al. | |
| 5,778,481 A | 7/1998 | Amsden et al. | |
| 6,061,867 A | 5/2000 | Schorpp et al. | |
| 6,464,010 B1 * | 10/2002 | Brown | E21B 37/02 15/104.2 |
| 8,234,739 B2 | 8/2012 | Frost et al. | |
| 8,778,087 B2 * | 7/2014 | Tyrrell | A46B 7/04 134/25.5 |
| 2007/0209135 A1 * | 9/2007 | Chen | H01L 21/67046 15/230 |

(Continued)

FOREIGN PATENT DOCUMENTS

| | | |
|---|---|---|
| CN | 202873538 U | 4/2013 |
| CN | 203 018 351 U | 6/2013 |

(Continued)

OTHER PUBLICATIONS

International Search Report and Written Opinion for PCT/US2015/055998 dated Jan. 15, 2016, 13 pages.
English translation of abstract of CN202873538U.

*Primary Examiner* — Michael Jennings
(74) *Attorney, Agent, or Firm* — Klintworth & Rozenblat IP LLP

(57) ABSTRACT

A cleaning device for cleaning a substrate is provided. In one aspect, the cleaning device includes a brush engaged with a mandrel, and the brush forms an Archimedean screw thread form. The brush is formed of an absorbent material, preferably foam. In one aspect, the brush is seated within a groove in the mandrel.

17 Claims, 6 Drawing Sheets

(56) References Cited

U.S. PATENT DOCUMENTS

2013/0048018 A1* 2/2013 Wargo ............... H01L 21/67046
  134/6
2013/0255721 A1* 10/2013 Tyrrell ............. H01L 21/02096
  134/6
2013/0302174 A1* 11/2013 Hindle .................... F04B 19/12
  416/236 R

FOREIGN PATENT DOCUMENTS

| JP | 60 186085 U | 12/1985 | |
|----|----|----|----|
| JP | H08 150377 A | 6/1996 | |
| JP | 2007 007501 A | 1/2007 | |
| KR | 100 818 559 B1 | 4/2008 | |
| WO | WO 2012170767 A1 * | 12/2012 | ............... B08B 1/04 |

* cited by examiner

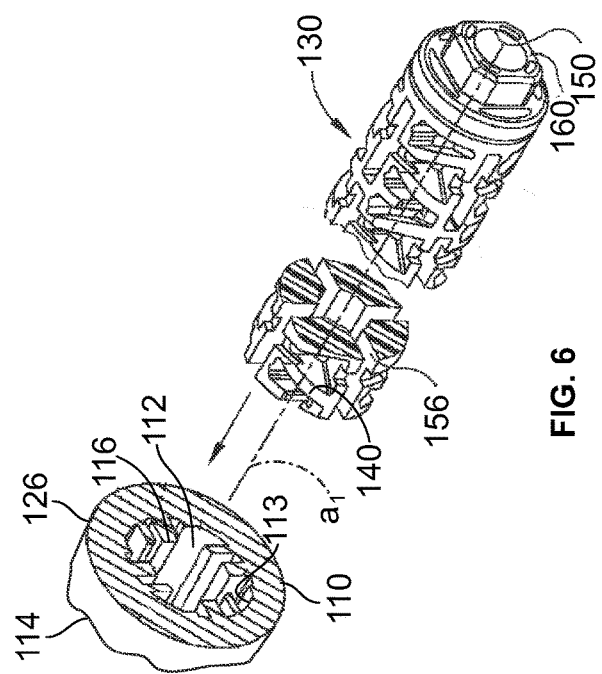
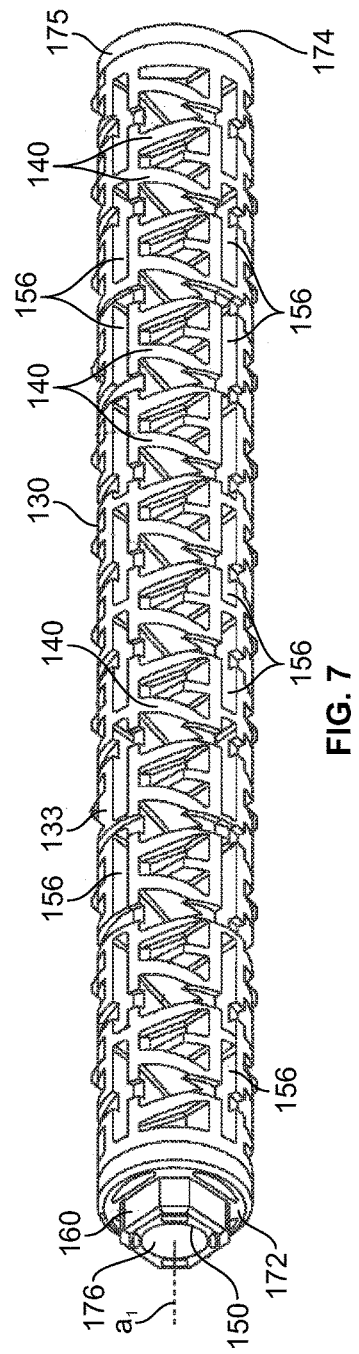
FIG. 6
FIG. 7

ARCHIMEDES BRUSH FOR SEMICONDUCTOR CLEANING

FIELD OF THE INVENTION

The present invention relates generally to processes and devices for cleaning articles. More specifically, it relates to a brush used for cleaning semiconductor substrates.

BACKGROUND

Cast cylindrical poly vinyl acetate (PVA) brushes are conventionally used in automatic cleaning systems to provide a post CMP (Chemical Mechanical Planarization) process to effectively clean surfaces of substrates such as semiconductor wafers or other disc-shaped substrates. PVA brushes are also used in cleaning systems to clean and dry glass and other non-disc-shaped substrates in flat panel display manufacture, glass production, and printed circuit board assembly. Brushes may have a length as short as 50 millimeters or as long as 10 meters, for example. The brushes extend completely across the substrate being treated, thereby contacting the substrate an entire distance across its diameter. The brushes are located on and driven by a central mandrel about a central longitudinal axis in the cleaning process. The brushes have nodules on their outer surface to help clean the substrate as shown in FIG. 1.

Conventional nodule PVA brushes rely on indiscriminate excitation to remove particles from semiconductor surfaces/substrates. The particles can be removed by lifting from the semiconductor surface/substrate, sliding over the semiconductor surface/substrate, or rolling on the semiconductor surface/substrate, as shown for example in FIG. 2. In FIG. 2, the nodules are shown by the small ovals, some of which are labeled with reference number 10, and the particles are shown by reference number 12. The hydrodynamic and/or electro-kinetic forces associated with conventional nodule PVA brushes do not move particles with any directionality off of the semiconductor surface/substrate to be cleaned. Because the center of a rotating semiconductor surface/substrate relies primarily on the forces exerted by the brush to remove particles, particle re-deposition is common and cleaning the center of the semiconductor surface/substrate is challenging. This problem is exacerbated with the transition to larger semiconductor surfaces/substrates (e.g. 300 mm to 450 mm).

SUMMARY

In one aspect, a cleaning device for cleaning substrates is provided. The cleaning device includes, but is not limited to, a brush engaged with a mandrel, and the brush forms an Archimedean screw thread form. The brush is formed of an absorbent material, preferably foam. In one aspect, the brush is seated within a groove in the mandrel.

The scope of the present invention is defined solely by the appended claims and is not affected by the statements within this summary.

BRIEF DESCRIPTION OF THE DRAWINGS

The invention can be better understood with reference to the following drawings and description. The components in the figures are not necessarily to scale, emphasis instead being placed upon illustrating the principles of the invention.

FIG. 6 depicts a partial perspective view of mandrel that can be used with the brush shown in FIGS. 5-5;

FIG. 6 depicts a perspective view of an example of the brush and a mandrel that can be used with the brush of FIGS. 3-5;

FIG. 7 depicts a perspective view of the mandrel shown in FIG. 6;

DETAILED DESCRIPTION

Figure 1:
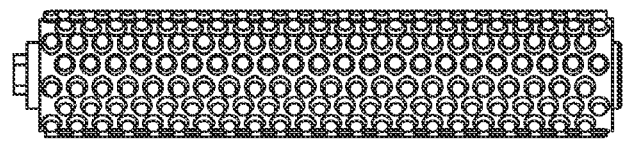
FIG. 1 depicts a side elevation view of a brush and mandrel in accordance with the prior art.
Figure 2:
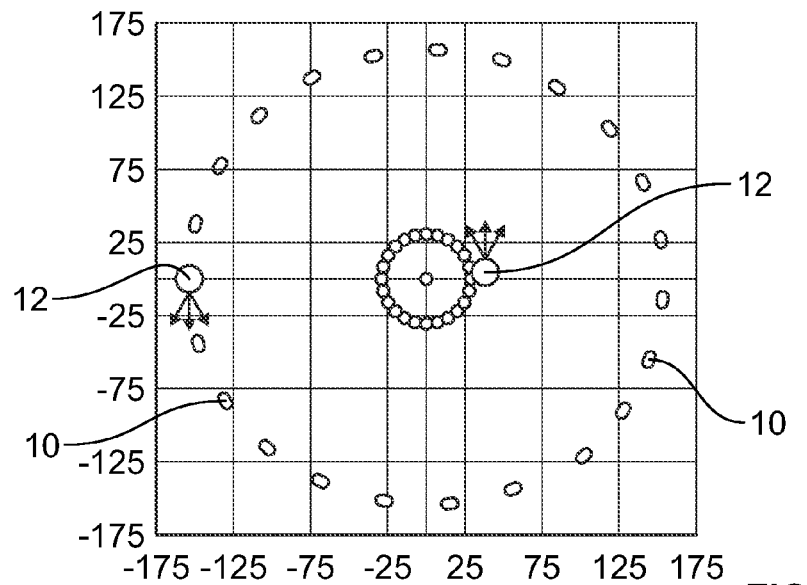
FIG. 2 depicts a schematic view of a showing of how the brush of FIG. 1 contacts a rotating substrate and how particles are moved on the substrate.

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein. Therefore, unless otherwise noted, features disclosed herein may be combined together to form additional combinations that were not otherwise shown for purposes of brevity.

Methods and systems consistent with the present disclosure overcome the disadvantages of conventional cleaning brushes and brush-mandrel systems by forming a cleaning brush 110, 110a adapted to provide a brush design that systematically moves particles 12 away from, and off, of the surface 106 of a substrate/semiconductor 104 to be cleaned, ultimately providing a more efficient cleaning process. In a first exemplary embodiment, a cleaning system 100 is provided which has a brush 110 formed on a mandrel 130, the brush 110 has an Archimedean screw formed therein. In a second exemplary embodiment, a cleaning system 100a is provided which has at least one brush 110a formed on a mandrel 130a, the at least one brush 110a is formed from an elongated member which seats within a groove 170a in the mandrel 130a, and each brush 110a forms an Archimedean screw thread form on the mandrel 130a. In the prior art, a mandrel as used herein is also commonly referred to as a "brush core".

With reference to FIGS. 3-7, there is shown a first embodiment of a cleaning system 100 for cleaning and polishing surfaces 106 of substrates/semiconductors 104, and with reference to FIG. 8-17, there is shown a second embodiment of a cleaning system 100a for cleaning and polishing surfaces 106 of substrates/semiconductors 104. The cleaning system 100, 100a may be an automatic cleaning system which can automatically or manually be set to polish and/or clean a substrate/semiconductor 104, and more particularly a surface 106 of the substrate/semiconductor 104. The brush 110 may be used in a conventional automatic cleaning system to provide a post chemical mechanical planarization (CMP) process to effectively clean the surface 106 of substrate/semiconductor 104. Substrate/semiconductor 104 includes any one of a variety of disc-shaped or non-disc-shaped substrates, such as: silicon based substrates including glass, dry glass, semiconductor wafers, flat panel display glass panels, glass production panels, and printed circuit boards; polymer-based substrates; and various types of semiconductor substrates such as silicon-based semiconductor substrates, single element semiconductor substrates, silicon on insulator (SOI) substrates, III-V semiconductor substrates, II-VI semiconductor substrates, other binary semiconductor substrates, ternary semiconductor substrates, quaternary semiconductor substrates; fiber optic substrates; superconducting substrates; glass substrates; fused quartz substrates; fused silica substrates; epitaxial silicon substrates; and organic semiconductor substrates.

Attention is invited to the first embodiment of the cleaning system 100 shown in FIGS. 3-7. The cleaning system 100 includes a generally cylindrically-shaped brush 110 having a hollow bore 112, a mandrel 130 engaging the brush 110 within the hollow bore 112, and a rotational device 102 engaging the mandrel 130. The illustrated mandrel 130 is only an exemplary mandrel and is not intended to be limiting. The cleaning system 100 may include a variety of other mandrels and all of such mandrel possibilities are intended to be within the spirit and scope of the present disclosure.

The brush 110 is a cast poly vinyl acetate (PVA) foam, a polyurethane foam, other polymeric foam. The brush 110 may be formed around a longitudinal central axis $a_1$, and may be balanced around the central axis $a_1$ in such a way that the centrifugal forces generated by the brush 110 and mandrel 130 as the brush 110 and mandrel 130 rotates around the central axis $a_1$ vary by no more than about ±20%, providing for a relatively balanced member. The brush 110 has opposite ends 124, 126, an outer surface 114 extending between the ends 124, 126, and an inner surface 113 which is opposed to the outer surface 114 and forms the hollow bore 112.

FIGS. 6 and 7 show an example of a mandrel 130 that can be used with the brush 110. The mandrel 130 may be generally cylindrically-shaped. The mandrel 130 has opposite ends 172, 174, an outer surface 133 extending between the ends 172, 174, and an inner surface 176 which is opposed to the outer surface 133 and forms a hollow fluid channel 150. The fluid channel 150 extends from the first end 172 of the mandrel 130 toward end 174, and has an opposite end which is closed by an end wall 175 formed by the mandrel 130. A plurality of pores 156 extend radially outwardly from the fluid channel 150 and extend between the fluid channel 150 and the outer surface 133 for flowing fluid from the fluid channel 150 to the outer surface 133 and to the brush 110. Such fluids may be used for cleaning and/or polishing the substrates/semiconductors 104. Suitable examples of such fluids may include, but are not limited to, acidic, alkaline, ultra-pure water.

The hollow bore 112 may be formed around the mandrel 130 by injection molding the brush 110 around an already formed mandrel 130 or the hollow bore 112 may be formed and then the brush 110 later placed around the mandrel 130. The hollow bore 112 is defined by the inner surface 113 of the brush 110. In an embodiment, and as is known in the art, the inner surface 113 may be interrupted by an engagement member 116 which mates with and surrounds an engagement member 140 of the mandrel 130. By forming the engagement member 116 around the engagement member 140, the brush 110 is securely fitted to the mandrel 130 in order to prevent slippage and movement between the mandrel 130 and the brush 110.

Figure 3:
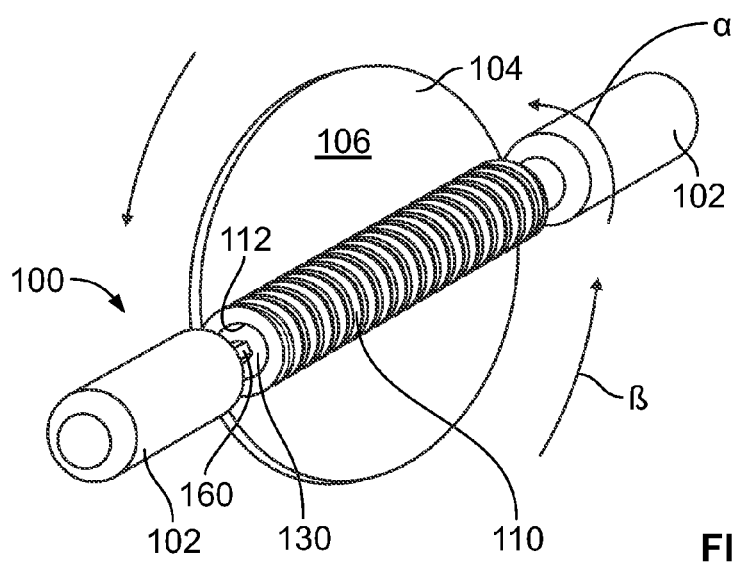
FIG. 3 depicts a perspective view of a cleaning system for cleaning and/or polishing substrates, in accordance with a first embodiment of the present invention.

The outer surface 133 of the mandrel 130 engages the brush 110 within the hollow bore 112. The brush 110 preferably covers the outer surface 133 of the mandrel 130 along the entire length of the mandrel 130, the length being defined as the distance between the ends 172, 174 of the mandrel 130. The outer surface 133 is secured to the inner surface 113 defining the hollow bore 112 of the brush 110. With reference to FIG. 3, outer surfaces 114 and 133 may be positioned about the central axis at of the mandrel 130.

With reference to FIG. 3, in one embodiment, the mandrel 130 also includes a rotational engagement member 160 for engaging and connecting with the rotational device 102. The rotational engagement member 160 is any device which can be used to connect with or fasten to another device, and includes things such as, for example, a nut-shaped piece or other polygonal shaped piece that is unitarily formed as one-piece with the mandrel 130 and can be fastened to the rotational device 102. The rotational device 102 includes any device which can induce a rotational movement onto the mandrel 130, such as an electrical motor, a gas motor or engine, a crank shaft power by a motor or manually powered, and any combination of pulleys, wheels, mechanical linkages, and/or gears moved automatically or manually. The rotational device 102 has a complimentary engagement member which connects with the rotational engagement member 160 for engaging and connecting the mandrel 130 with the rotational device 102.

Figure 4:
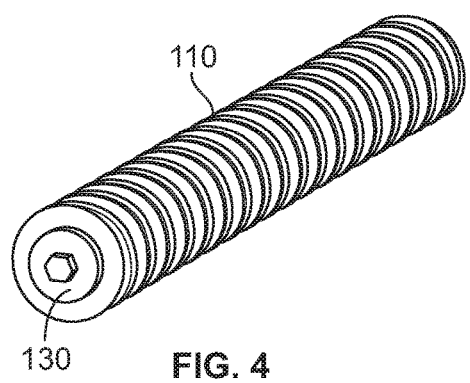
FIG. 4 depicts a perspective view of the brush and its mandrel of the cleaning system of FIG. 3.
Figure 5:
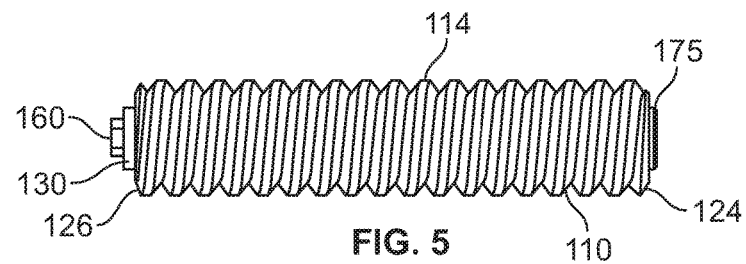
FIG. 5 depicts a side elevation view of the brush and its mandrel of FIG. 4.

As best shown in FIGS. 3-5, the outer surface 114 of the brush 110 has an Archimedean screw thread form formed of a spiral thereon which continuously extends from end 124 to end 126 of the brush 110. The Archimedean screw thread form may be formed with a variety of pitches along its length. The Archimedean screw thread form may be molded when the brush 110 is formed or may be machined into the outer surface 114 of the brush 110. When machined, the outer surface 114 of the brush 110 is formed as a cylinder and the Archimedean screw thread form is machined into the outer surface 106.

Attention is invited to the second embodiment of the cleaning system 100a shown in FIGS. 8-17. The cleaning system 100a includes a generally cylindrically-shaped mandrel 130a having a hollow fluid channel 150a, at least one brush 110a engaging the mandrel 130a, and a rotational device 102 engaging the mandrel 130a.

The mandrel 130a has opposite ends 172a, 174a, an outer surface 133a extending between the ends 172a, 174a, and an inner surface 177a which is opposed to the outer surface 133a and forms the hollow fluid channel 150a. The fluid channel 150a extends from the end 172a of the mandrel 130a toward end 174a, and has an opposite end which is closed by an end wall 175a formed by the mandrel 130a. The mandrel 130a may be formed by injection molding. The outer surface 133a of the mandrel 130a may be formed around a longitudinal central axis $a_1$, and may be balanced around the central axis $a_1$ in such a way that the centrifugal forces generated by the brush 110a and mandrel 130a as the brush 110a and mandrel 130a rotates around the central axis $a_1$ vary by no more than about ±20%, providing for a relatively balanced member. The mandrel 130a is formed of a rigid material, and is may, for example, be formed of plastic, PET, PVC.

Figure 14:
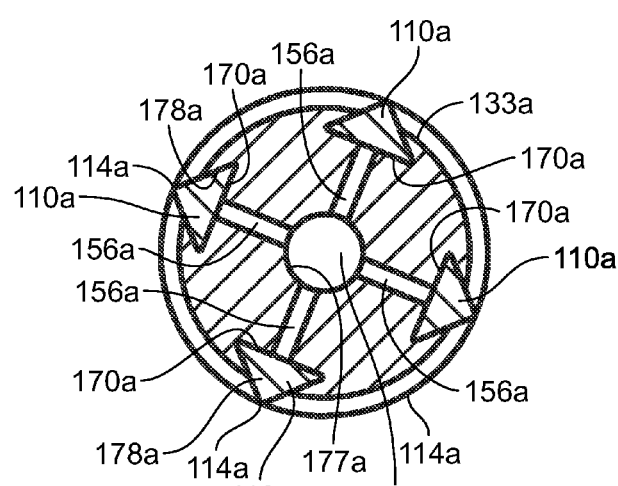
FIG. 14 depicts a cross-sectional view along line 14-14 of FIG. 13.
Figure 16:
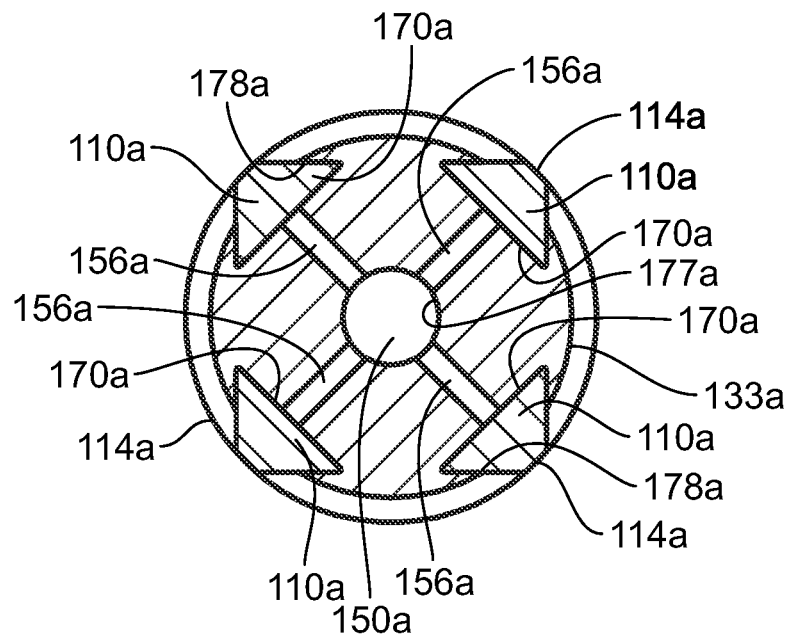
FIG. 16 depicts a cross-sectional view along line 16-16 of FIG. 15.

The outer surface 133a of the mandrel 130a has at least one continuous groove 170a therein formed as a spiral which forms an Archimedean screw thread form, and which extends continuously along the mandrel 130a, and preferably extends from end 172a to end 174a. The turns of the Archimedean screw thread form are separated from each other by the outer surface 133a of the mandrel 130a such that the outer surface 133a is exposed. As shown in the exemplary embodiment, the mandrel 130a has four grooves 170a forming four Archimedean screw thread forms, each groove 170a extending continuously along the mandrel 130a, and preferably extending from end 172a to end 174a, and which are spaced apart from each other by the outer surface 133a of the mandrel 130a. If more than one Archimedean screw thread(s) form is provided, the Archimedean screw thread(s) form may be formed of a variety of pitches. The Archimedean screw thread form(s) may be molded when the mandrel 130a is formed or may be machined into the outer surface 133a of the mandrel 130a. When machined, the outer surface 133a of the mandrel 130a is formed as a cylinder and the groove(s) is(are) machined into the outer surface 133a. Each groove 170a is formed form a wall 178a which formed in the mandrel 130a. The wall 178a may take a variety of cross-sectional shapes. For example, the cross-sectional shape of the walls 178a may be arcuate as shown in FIG. 11; and may be of a non-arcuate shape, such as for example, generally triangular as shown in FIGS. 14 and 16.

Figure 11:
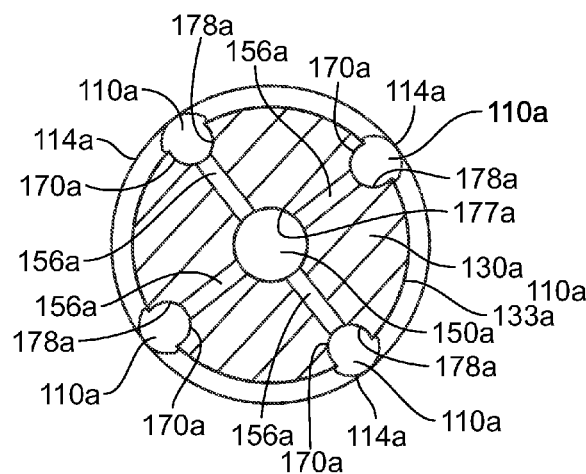
FIG. 11 depicts a cross-sectional view along line 11-11 of FIG. 10.
Figure 12:
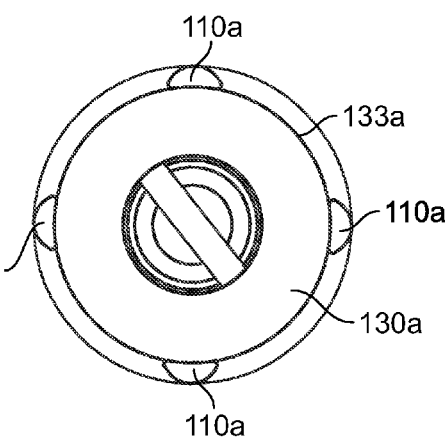
FIG. 12 depicts an end elevation view of the brush and its mandrel of FIG. 9.

With reference to FIG. 11, fluid channel pores 156a are formed between the wall 178a and the hollow fluid channel 150a for flowing fluid from the fluid channel 150a to the outer surface 133a of the mandrel 130a and to the brush(es) 110a. Such fluids may be used for cleaning and/or polishing the substrates/semiconductors 104. Suitable examples of such fluids may include, but are not limited to, acidic, alkaline, ultra-pure water.

In one embodiment, the mandrel 130a also includes a rotational engagement member 160a for engaging and connecting with the rotational device 102 (like that of FIG. 3). The rotational engagement member 160a is any device which can be used to connect with or fasten to another device, and includes things such as, for example, a nut-shaped piece or other polygonal shaped piece that is unitarily formed as one-piece with the mandrel 130a and can be fastened to the rotational device 102. The rotational device 102 includes any device which can induce a rotational movement onto the mandrel 130a, such as an electrical motor, a gas motor or engine, a crank shaft power by a motor or manually powered, and any combination of pulleys, wheels, mechanical linkages, and/or gears moved automatically or manually. The rotational device 102 has a complimentary engagement member which connects with the rotational engagement member 160a for engaging and connecting the mandrel 130a with the rotational device 102.

Figure 13:
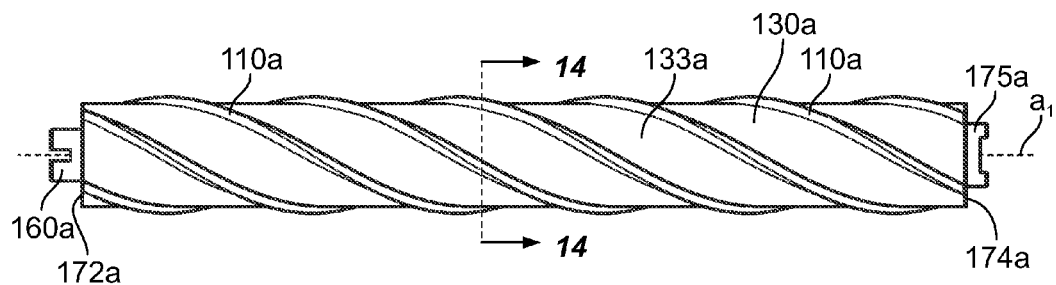
FIG. 13 depicts a side elevation view of a modified brush and its mandrel.
Figure 15:
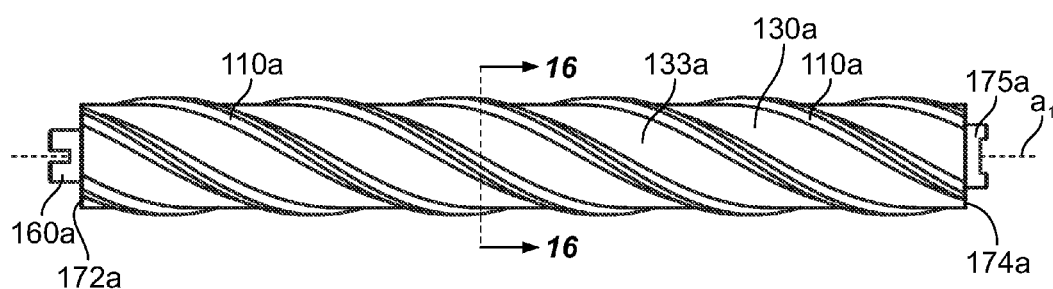
FIG. 15 depicts a side elevation view of another modified brush and its mandrel.

A brush 110a engages within each groove 170a formed on the mandrel 130a. Each brush 110a is a poly vinyl acetate (PVA) foam, a polyurethane foam, other polymeric foam, or other absorbent material adapted to satisfactorily clean and/or polish the surface 106 of the substrate/semiconductor 104. As shown, each brush 110a is an elongated thin member which partially seats within the groove 170a in the mandrel 130a and partially extends outwardly from the outer surface 133a of the mandrel 130a. The brush 110a may fully seat within the groove 170a to fill the groove 170a, or may partially seat within the groove 170a such that a gap is provided between the brush 110a and a portion of the groove 170a which is closest to the central axis $a_1$. The brush 110a may have a variety of cross-sections, such as having a circular shape as shown in FIGS. 9-12, or non-circular shape, such as for example but not limited to, triangular as shown in FIGS. 13 and 14, trapezoidal as shown in FIGS. 15 and 16, elliptical, pentagonal, octagonal. An outer surface 114a of each brush 110a is radially outwardly of the outer surface 133a of the mandrel 130a. The cross-sectional shape of the outer surface 114a of each brush 110a may take a variety of shapes, for example, but not limited to, curved as shown in FIGS. 9-12, the apex of a triangle as shown in FIGS. 13 and 14, and generally planar as shown in FIGS. 15 and 16. Each brush 110a seats within its associated groove 170a, each groove 170a is slightly smaller than the brush 110a which seats therein, and each brush 110a is secured within the groove 170a preferably by a friction fit. Other structures for securing the brush 110a into the groove 170a may be provided, such as adhesives and the like. Since the groove 170a is smaller than the associated brush 110a seated therein, the wall 178a of the groove 170a forms an engagement member to prevent rotational and axial movement between the mandrel 130a and the brush(es) 110a, and to prevent slippage between the mandrel 130a and the brush(es) 110a. As such, at least one Archimedean screw thread(s) form is formed by the brush(es) 110a.

If more than one brush 110a is provided on the mandrel 130a, the pitch of the Archimedean screw thread(s) form formed by the brush(es) 110a may vary between the various brushes 110a. The brush(es) 110a can be removed from the mandrel 130a and replaced if they become worn.

In operation, the brush(es) 110, 110a is/are attached to the mandrel 130, 130a. The mandrel 130, 130a with the brush(es) 110, 110a mounted thereon are then connected with the rotational device 102 by connecting the rotational engagement member 160, 160a with engagement members on the rotational device 102. Thereafter, the mandrel 130, 130a with the brush(es) 110, 110a mounted thereon is rotated in the rotational direction α about the central axis $a_1$, which central axis $a_1$ is parallel to surface of the surface 106 of the substrate/semiconductor 104. While rotating the brush(es) 110, 110a, or before rotating the brush(es) 110, 110a, the brush(es) 110, 110a is placed near and engages the surface 106 of the substrate/semiconductor 104. In the illustrated exemplary embodiment, the brush(es) 110, 110a and mandrel 130, 130a are supported at both ends and contacts only a portion of the surface 106 of the substrate/semiconductor 104 across its diameter. In an embodiment, the brush(es) 110, 110a and mandrel 130, 130a may be supported only at one end thereof. In some embodiments of the present disclosure, the brush(es) 110, 110a and mandrel 130, 130a contacts less than the entire diameter of the surface 106 of the substrate/semiconductor 104 (i.e., less than 100 percent of the diameter of the substrate/semiconductor 104). In other embodiments of the present disclosure, the brush(es) 110, 110a and mandrel 130, 130a contacts less than about 70 percent of the diameter of the substrate/semiconductor 104. In further embodiments of the present disclosure, the brush(es) 110, 110a and mandrel 130, 130a contacts less than about 60 percent of the diameter of the substrate/semiconductor 104. In still other embodiments of the present disclosure, the brush(es) 110, 110a and mandrel 130, 130a contacts about 50 percent of the diameter of the substrate/semiconductor 104.

Figure 8:
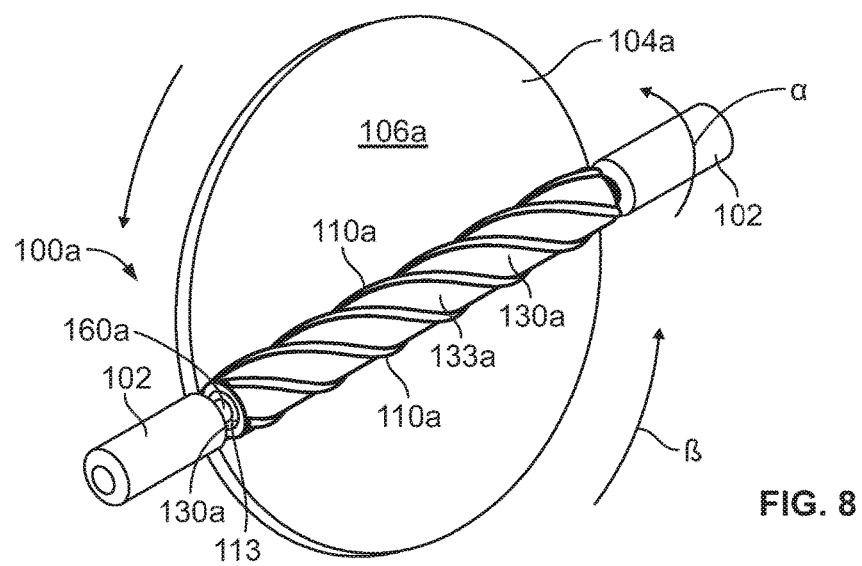
FIG. 8 depicts a perspective view of a cleaning system for cleaning and/or polishing substrates, in accordance with a second embodiment of the present invention.
Figure 9:
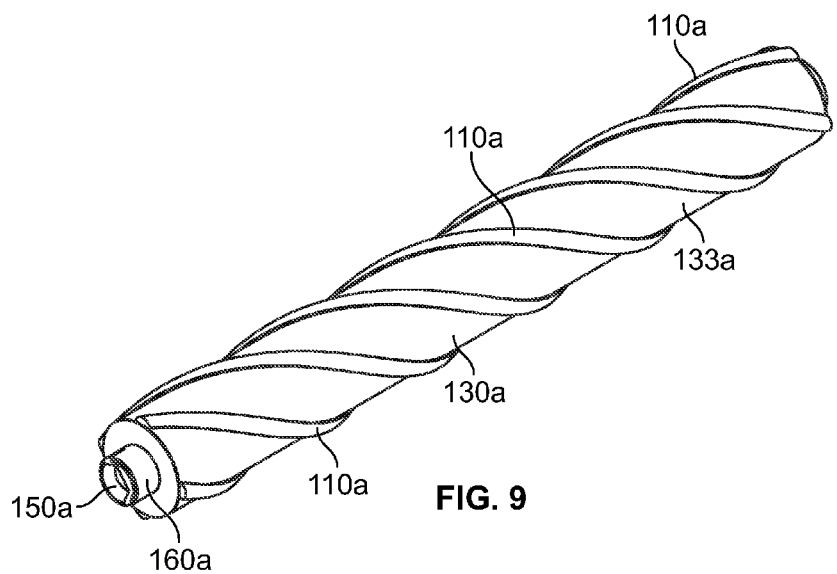
FIG. 9 depicts a perspective view of the brush and its mandrel of the cleaning system of FIG. 8.
Figure 10:
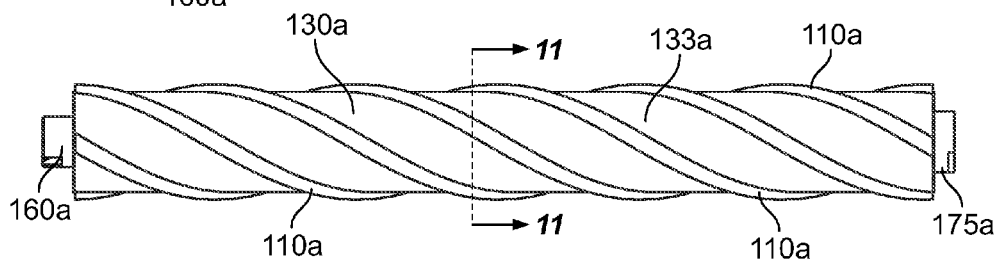
FIG. 10 depicts a side elevation view of the brush and its mandrel of FIG. 9.

With reference to FIG. 8, the brush(es) 110, 110a engages the substrate/semiconductor 104 with the mandrel 130, 130a positioned about the first central axis $a_1$. Upon engaging the brush(es) 110, 110a with the substrate/semiconductor 104, the brush(es) 110, 110a is then rotated about the first central axis $a_1$ in a first rotational direction α and the substrate/semiconductor 104 is rotated about a second central axis formed through the center of the substrate/semiconductor 104 in a second rotational direction β. The first central axis $a_1$ is radially aligned with and intersects the second central axis. The rotational motion of the brush(es) 110, 110a on the surface 106 helps to clean and/or polish the surface 106. In one embodiment, fluid is pumped through fluid channel 150, 150a and into the brush(es) 110, 110a through the pores 156, 156a. The fluid helps to further clean and/or polish the substrate/semiconductor 104. With the second embodiment, the pores 156a are provided directly beneath the brush(es) 110, 110a to ensure that fluid is directed to the brush(es) 110, 110a.

Figure 17:
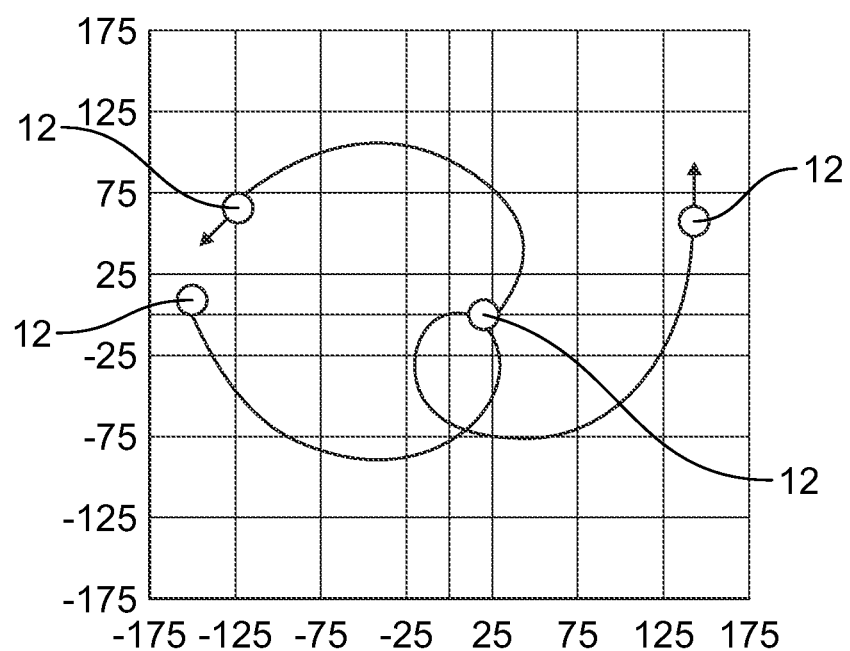
FIG. 17 is a schematic view of a showing of how the brush of FIGS. 8-16 contacts a rotating substrate and how particles are moved on the substrate.

In each embodiment, and as shown in FIG. 17, the Archimedean screw thread form formed by the brush(es) 110, 110a systematically moves particles 12 away from, and off, of the substrate/semiconductor surface 106, ultimately providing a more efficient cleaning process. The particles 12 on the substrate/semiconductor surface 106 are gathered by the outer surface 114, 114a of the brush(es) 110, 110a and travel along the length of the brush(es) 110, 110a and are ejected from the ends of the brush(es) 110, 110a. As a result, the Archimedean screw thread form provides for an improved cleaning in the center of the substrate/semiconductor 104 versus convention nodule designs on prior art brushes.

It should be understood that the brush(es) 110, 110a disclosed herein are adapted to clean and/or polish any size and shape of substrate/semiconductor 104. In addition, while the illustrative examples above describe cleaning systems 100, 100a which have a generally cylindrically-shaped brush 110 or mandrel 130, 130a, the brush 110 or mandrel 130, 130a (which in the second embodiment would also result in a conically shaped brush(es) 110a) may be conically shaped.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While various embodiments of the invention have been described, it will be apparent to those of ordinary skill in the art that other embodiments and implementations are possible within the scope of the invention. Accordingly, the invention is not to be restricted except in light of the attached claims and their equivalents.

The invention claimed is:

1. A cleaning device for cleaning a substrate, the cleaning device comprising:
   a rigid mandrel having a cylindrical outer surface, a wall forming a spiral groove extending inwardly from the outer surface; and
   a brush formed of an absorbent material, the brush being seated within the groove and extending outwardly from the outer surface of the mandrel, the brush forming a continuous thread form having turns, wherein a portion of the outer surface of the mandrel is not covered by the brush between adjacent turns of the brush.

2. The cleaning device of claim 1, wherein the brush is formed of one of a poly vinyl acetate foam, a polyurethane foam, and a polymeric foam.

3. The cleaning device of claim 1, wherein the groove extends from a first end of the mandrel brush to a second, opposite end of the mandrel.

4. The cleaning device of claim 1, wherein the brush has a circular cross-section.

5. The cleaning device of claim 1, wherein the brush has a non-circular cross-section.

6. The cleaning device of claim 1, wherein the mandrel has a passageway therethrough extending from an end of the mandrel, and a plurality of pores extending from the passageway to the wall of the groove.

7. The cleaning device of claim 1, wherein the brush is engaged within the groove by a friction fit.

8. The cleaning device of claim 1, wherein the brush is retained within the groove by an adhesive.

9. The cleaning device of claim 1, wherein the brush has a larger cross-section than a cross-section of the groove in which the brush is seated.

10. A cleaning device for cleaning a substrate, the cleaning device comprising:
    a rigid mandrel having a cylindrical outer surface, a plurality of walls extending inwardly from the outer surface, each the wall forming a spiral groove; and
    a plurality of brushes formed of an absorbent material, respective ones of the brushes being at least partially seated within a respective groove thereby forming a plurality of continuous thread forms, and such that portions of the outer surface of the mandrel are not covered by the brushes between adjacent turns of the brushes.

11. The cleaning device of claim 10, wherein the grooves have the same pitch.

12. The cleaning device of claim 10, wherein the grooves have differing pitches.

13. The cleaning device of claim 10, wherein each brush is formed of one of a polyvinyl alcohol foam, a polyurethane foam, and a polymeric foam.

14. The cleaning device of claim 10, wherein the mandrel has a passageway therethrough extending from an end of the mandrel, and a plurality of pores extending from the passageway to the walls of the grooves.

15. The cleaning device of claim 10, wherein the brush is engaged within the respective groove by a friction fit.

16. The cleaning device of claim 10, wherein each brush is retained within the respective groove by an adhesive.

17. The cleaning device of claim 10, wherein each brush has a larger cross-section than a cross-section of the groove in which the brush is seated.

* * * * *